United States Patent [19]

Sakano

[11] Patent Number: 4,875,190

[45] Date of Patent: Oct. 17, 1989

[54] TWO-DIMENSIONAL MEMORY UNIT HAVING A 2D ARRAY OF INDIVIDUALLY ADDRESSABLE BLOCKS EACH HAVING A 2D ARRAY OF CELLS

[75] Inventor: Yukio Sakano, Tokyo, Japan

[73] Assignee: Ricoh Company, Ltd., Tokyo, Japan

[21] Appl. No.: 135,349

[22] Filed: Dec. 21, 1987

[30] Foreign Application Priority Data

Dec. 26, 1986 [JP] Japan ................................ 61-310101

[51] Int. Cl.$^4$ .............................................. G11C 7/00
[52] U.S. Cl. ............................ 365/189.04; 365/230.03; 365/233
[58] Field of Search ............... 365/189, 230, 233, 236, 365/231

[56] References Cited

U.S. PATENT DOCUMENTS

| | | | |
|---|---|---|---|
| 4,644,503 | 2/1987 | Bantz et al. ...................... | 365/230 X |
| 4,675,849 | 6/1987 | Kinoshita ........................ | 365/230 X |
| 4,701,885 | 10/1987 | McElroy ......................... | 365/189 X |
| 4,740,923 | 4/1988 | Kaneko et al. .................. | 365/189 |
| 4,740,927 | 4/1988 | Baker et al. .................... | 365/189 |
| 4,742,474 | 5/1988 | Knierim ........................... | 365/230 |
| 4,757,473 | 7/1988 | Kurihara et al. ................ | 365/89 X |
| 4,773,048 | 9/1988 | Kai ................................... | 365/230 X |

FOREIGN PATENT DOCUMENTS 61-173354 8/1986 Japan .

*Primary Examiner*—Stuart N. Hecker
*Assistant Examiner*—Alfonso Garcia
*Attorney, Agent, or Firm*—Cooper & Dunham

[57] ABSTRACT

A two-dimensional memory unit allowing two-dimensional data to be written and read along different axes. Memory blocks having numerous memory cells arranged along each of the axes, are located at respective memory addresses, and a number of such memory blocks are arranged along the respective axes. All the memory cells of any of the memory blocks are accessed at the same time. The memory cells for actually inputting and outputting data are selected by data input and ouput controls. Data are written or read out of all of the number of memory cells in a two-dimensional small area by one memory access and, therefore, rapidly with no regard to the direction of scanning which occurs along any of the different axes.

8 Claims, 21 Drawing Sheets

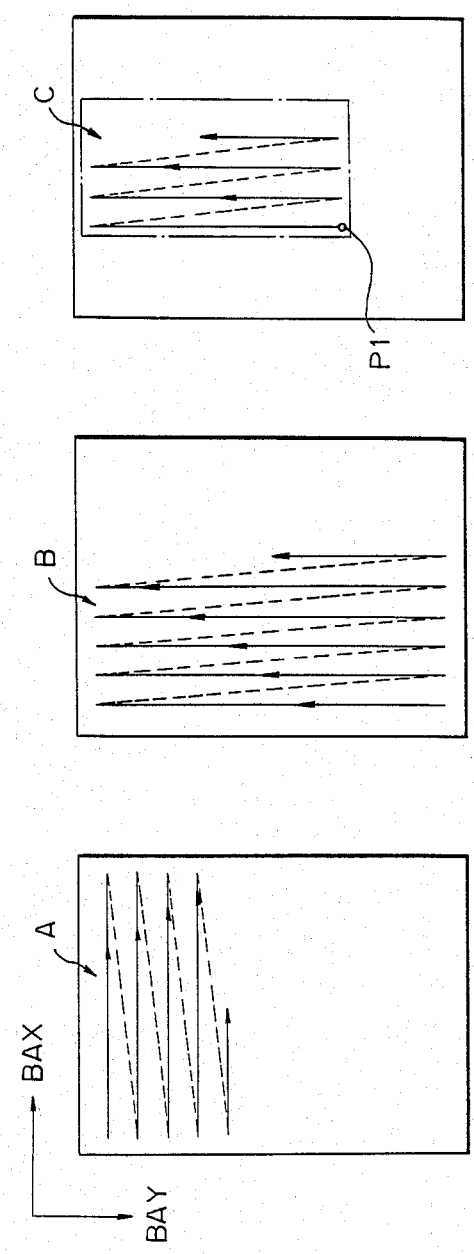

Fig. 8b

| | BAX | BAY |
|---|---|---|
| PA3 | 0 | 840 |
| PA4 | 0 | 594 |
| PA5 | 0 | 420 |
| PA6 | 0 | 297 |
| ⋮ | | |
| PB3 | 0 | 1030 |
| PB4 | 0 | 728 |
| PB5 | 0 | 515 |
| PB6 | 0 | 364 |
| ⋮ | | |
| PA01 | 297 | 0 |
| ⋮ | | |
| PA31 | 297 | 840 |
| ⋮ | | |
| PA51 | 297 | 420 |
| ⋮ | | |
| $P_i(X_1,Y_1)$ | $X_1$ | $Y_1$ |

TWO-DIMENSIONAL MEMORY UNIT HAVING A 2D ARRAY OF INDIVIDUALLY ADDRESSABLE BLOCKS EACH HAVING A 2D ARRAY OF CELLS

BACKGROUND OF THE INVENTION

The present invention relates to a memory unit for storing image data and other two-dimensional data and, more particularly, to a two-dimensional memory unit which allows two-dimensional data to be written and read along axes which are different from each other.

A two-dimensional memory unit, or bit map memory, is extensively used with various kinds of equipment. In a graphic display, for example, a two-dimensional area having numerous fine pixels arranged two-dimensionally therein is associated with a screen, and one or more bits of memory are allocated to each of the pixels. When image data read by an image scanner need be stored in the event of printing which uses a laser printer or like recorder, it is necessary to use a two-dimensional memory unit for a buffer memory.

In a two-dimensional memory unit of kind described, individual memory cells are accessible on the basis of x and y addresses which are associated with, respectively, an x and a y axis of input image, so that a desired pixel of an image may be rapidly accessed in a memory. When an input image and/or an output image is scanned at a high rate, a prerequisite is that the period of time necessary for accessing each memory cell be extremely short. However, a memory with a short access time is prohibitively expensive. For this reason, it is a common practice to use a parallel data type memory unit in which eight bits are assigned to each memory address and represent a pixel address with respect to the direction of main scanning, which occurs at a high rate, in terms of an X direction address XM of the memory and a bit position BM of a particular memory cell. Specifically, eight memory cells located at the same address are associated with eight pixels whose pixel addresses x are continuous. It follows that when the memory is continuously accessed in the x direction timed to scanning, eight pixels are accessed at the same time resulting that the access time required of the memory is eight times longer than the access time for each pixel.

In a two-dimensional memory unit of the kind described, while rapid access is achievable so long as a string of pixels arranged in the main scanning direction are accessed, it is unachievable when it comes to a group of pixels arranged in the subscanning direction because the memory address changes with the pixel, i.e., the memory has to be accessed for each pixel. In a digital copier, for example, in the event when an image read by an image scanner is recorded by a laser printer, it is sometimes desired to change the scanning direction associated with the input image and the scanning direction associated with the recorded image by 90 degrees relative to each other. This is impracticable, however, because the scanning direction of an image scanner and that of a laser printer are mechanically determined. If an image read by an image scanner is temporarily stored in a two-dimensional memory unit, the scanning direction can be electrically changed by 90 degrees by switching the X, Y address for accessing the memory depending upon the read/write operation. Nevertheless, an ordinary two-dimensional memory unit cannot change the scanning direction without lowering the accessing rate as stated above, failing to performing rapid processing.

An implementation for solving the above problem is disclosed in Japanese Laid-Open Patent Publication (Kokai) No. 61-173354/1986. While the implementation disclosed is capable of accessing eight pixel data at a time in each of x and y scanning directions, a prohibitively complicated address generation circuit is required when the memory capacity is large. In addition, since it inputs and outputs data on a word basis through a data bus, the pixel access time is not constant causing a delay to occur every time the word is replaced. This kind of memory device, therefore, is not applicable to a case wherein pixel data have to be inputted and outputted at a constant period timed to the scanning timing of an input device and that of an output device.

SUMMARY OF THE INVENTION

It is, therefore, an object of the present invention to provide a two-dimensional memory unit capable of easily switching an address scanning axis for data writing and that for data reading.

It is another object of the present invention to provide a two-dimensional memory unit which promotes rapid access along each of the x and y axes.

It is another object of the present invention to provide a two-dimensional memory unit which sequentially accesses all the memory cells at a constant rate.

It is another object of the present invention to provide a generally improved two-dimensional memory unit.

A two-dimensional memory device of the present invention comprises a memory block having a plurality of memory cells arranged along each of at least two axes, a memory block assembly having a plurality of such memory blocks arranged along each of at least two axes, an address information generating circuit for generating address information with respect to each of the axes of the memory block assembly and accessing all the memory cells of any of the memory blocks, which is selected based on the address information, at the same time during at least one of data writing and data reading, and a data input and output control for performing selection control on data which are inputted or outputted from a memory cell group of the memory block, which is accessed by the address information generating circuit, during at least one of data writing and data reading.

BRIEF DESCRIPTION OF THE DRAWINGS

The above and other objects, features and advantages of the present invention will become more apparent from the following detailed description taken with the accompanying drawings in which:

FIG. 7d is a schematic view showing different directions for scanning a memory;

FIG. 8b is a memory map representative of a reference table which is stored in a control unit;

DESCRIPTION OF THE PREFERRED EMBODIMENTS

Figure 2:
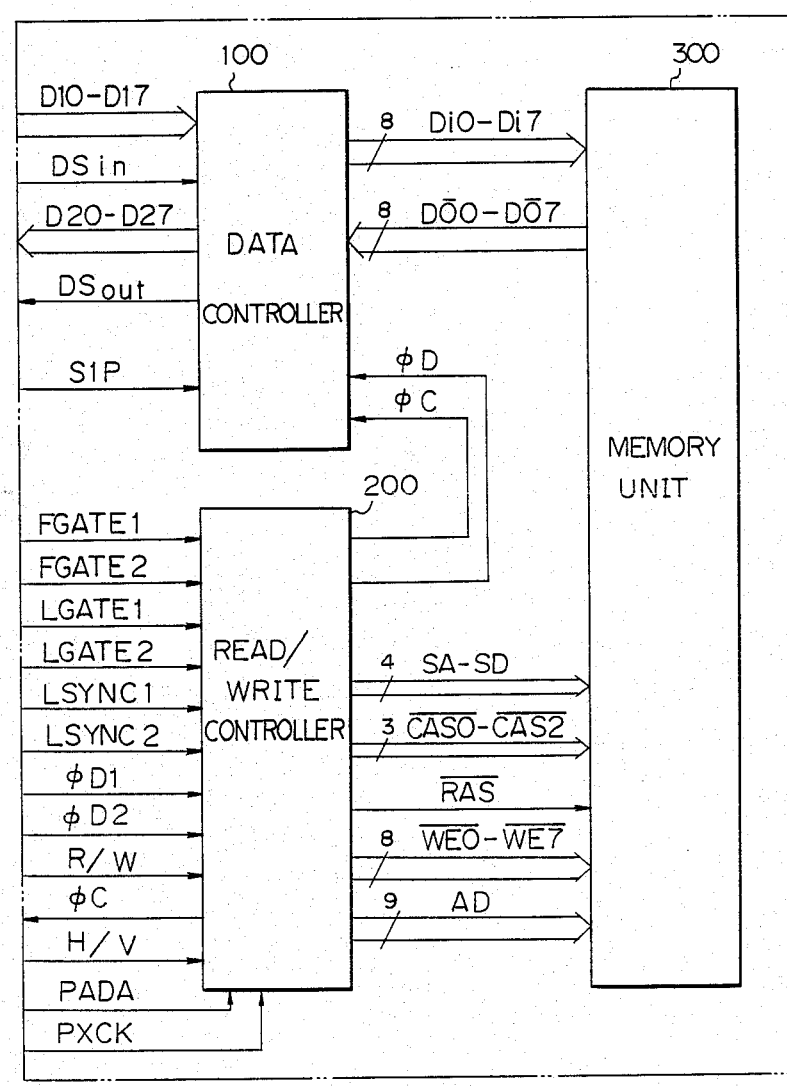
FIG. 2 is a schematic block diagram showing an image memory board in accordance with the present invention.

Referring to FIG. 2, an image memory board for practicing the present invention is shown. It is to be noted that various signals which are overlined in the figure are shown with underlines in the following description.

In FIG. 2, the image memory board is made up of a data controller 100, a read/write controller 200, and a memory unit 300. The data controller 100 has eight data input lines D10 to D17, a serial data input line DSin, eight data output lines D20 to D27, a serial data output line DSout and an input switching signal line S1P each of which is connected to an external electric circuit through a different terminal of the memory board. The signal line S1P is adapted to select either one of a serial data input/output line and a parallel data input/output line. Signal lines FGATE1, FGATE2, LGATE1, LGATE2, LSYNC1, LSYNC2, φD1, φD2, R/W, φC, H/V, PADA and PXCK associated with the read/write controller 200 are each connected to an external electric circuit through a different terminal of the memory board. Specifically, the signal lines FGATE1, LGATE1, LSYNC1 and φD1 are connected to a device for applying data to a memory, e.g., an image scanner, the signal lines FGATE2, LGATE2, LSYNC2 and φD2 are connected to a device for reading data out of a memory, e.g., a printer, and the other signal lines are connected to a device for controlling the entirety of the system including such devices.

The signal lines stated above are used to pass the following signals.

FGATE1 and FGATE2: a signal indicative of valid/invalid of data in the subscanning direction LGATE1 and LGATE2: a signal indicative of valid/invalid of data in the main scanning direction LSYNC1 and LSYNC2: a main scanning synchronizing signal φD1 and φD2: a data clock signal R/W: a memory read/write control signal φC: a character-by-character synchronizing clock signal H/V: a signal for controlling the scanning direction (horizontal/vertical) in the memory unit 300

PADA: serial data designating a scanning start address of the memory unit 300

PXCK: a clock signal for synchronizing serial data sent over PADA

The data controller 100 and the memory unit 300 are connected to each other by eight data input lines Di0 to Di7 and eight data output lines Do0 to Do7. The read/write controller 200 and the memory unit 300 are connected together by four signal lines SA to SD, three signal lines CAS0 to CAS2, one signal line RAS, eight signal lines WE0 to WE7, and nine address lines AD. Further, the data controller 100 and the read/write controller 200 are connected together by signal lines φD and φC.

Figure 1:
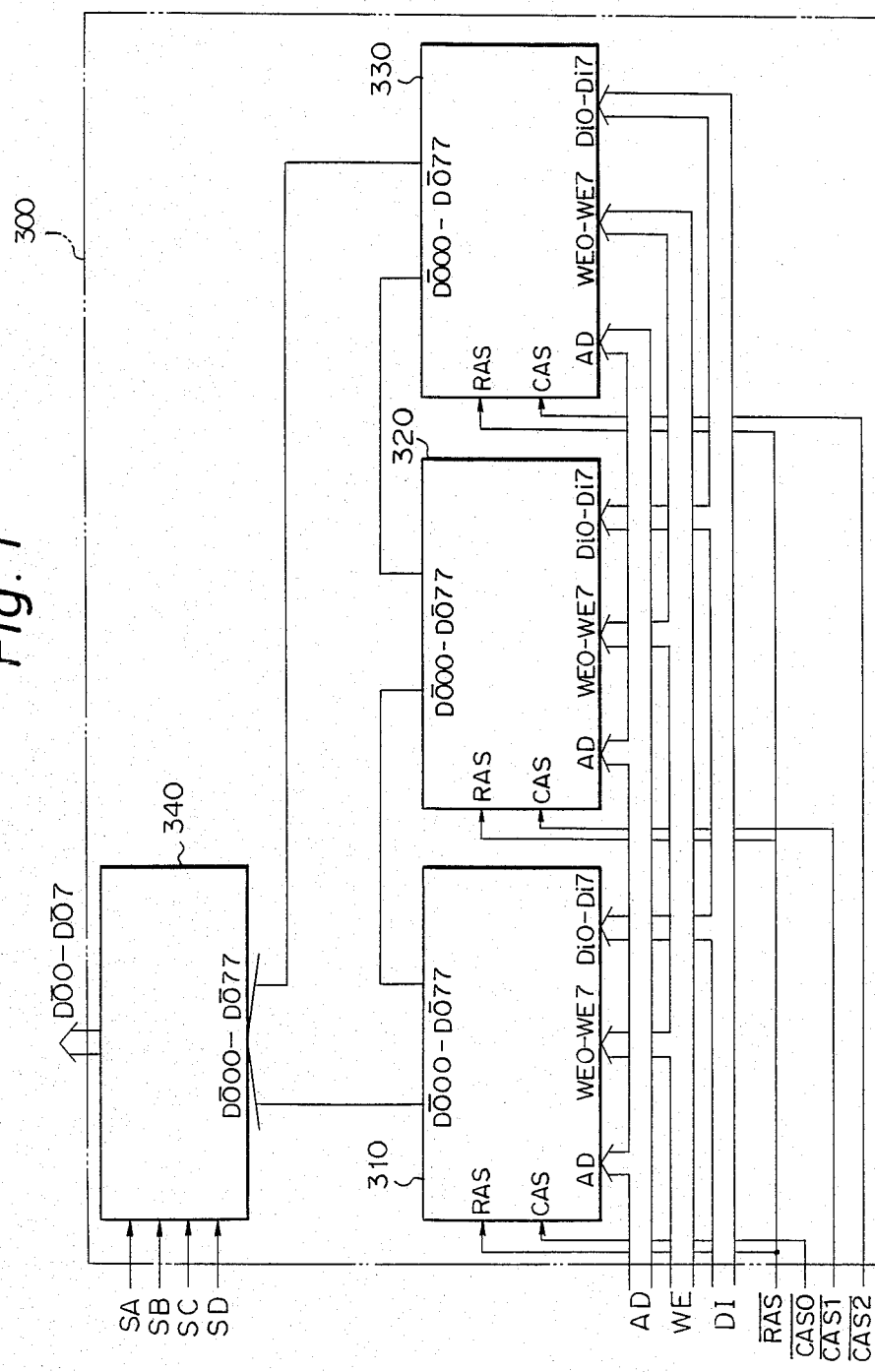
FIG. 1 is a schematic block diagram showing a memory unit which is shown in FIG. 2.

Referring to FIG. 1, the memory unit 300 is shown in a schematic block diagram. As shown, the memory unit 300 is made up of three independent memory banks 310, 320 and 330, and a data selector circuit 340. The memory banks 310, 320 and 330 are constructed in the same manner as each other.

Figure 3A:
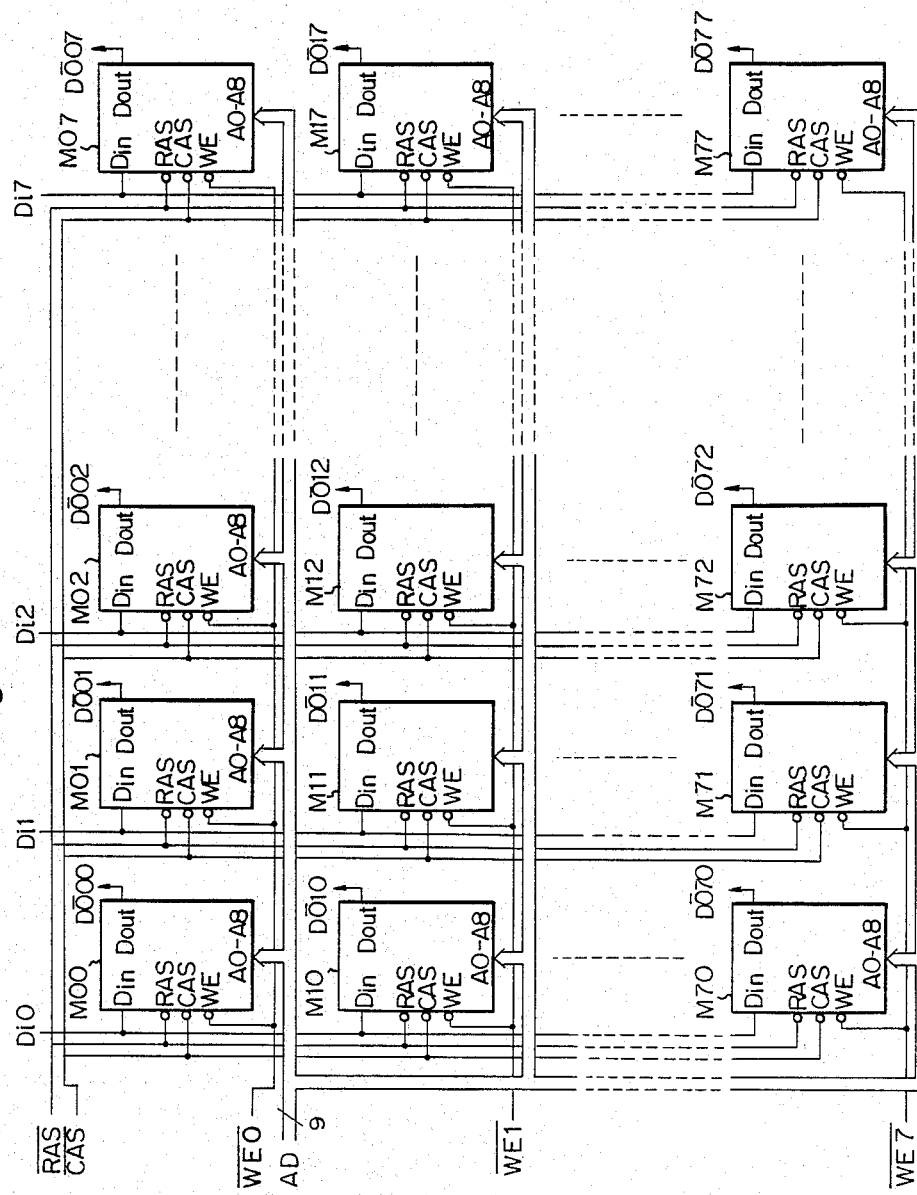
FIGS. 3a and 3b are schematic block diagrams showing, respectively, a memory bank and a data selector circuit as shown in FIG. 1.

FIG. 3A shows the construction of the memory bank 310 by way of example. In the figure, M00, M01, M02, ..., M77 each designates a memory chip of a dynamic RAM (random access memory) having a 256×1 bit construction. While a part of such memory chips is omitted in the figure, sixty-four memory chips are arranged in practice in an 8×8 matrix. As regards a label Mxy associated with each memory chip, x and y are representative of, respectively, a memory chip position in the horizontal direction and a memory chip position in the vertical direction. Each memory chip is provided with one data input terminal Din, one data output terminal Dout, nine address terminals A0 to A8, and control terminals RAS, CAS and WE. Despite that only nine address terminals are present as stated, the addresses of eighteen bits can be designated because, as well known in the art, address information is inputted segmented into two and on a time division basis. Hence, each memory chip has memory cells at 262, 144 different addresses. The control terminals RAS and CAS are adapted to provide, respectively, the timing of row addresses and that of column addresses. The control terminal WE is used to select one of a data read mode and a data write mode. When the control terminal WE is (logical) low level, L, data are written in the memory chip.

The address terminal A0 to A8 of all the memory chips M00 to M77 are connected to a common address line AD. The data input terminals Din of each eight memory chips which are continuously arranged in the vertical direction are connected to each other. The data input terminals of the individual groups My1 (y=0 to 7), My2, My3, My4, My5, My6 and My7 are connected to the signal input lines Di0, Di1, Di2, Di3, Di4, Di5, Di6 and Di7, respectively. The data input terminals Dout of the individual memory chips Myx are each connected to a different signal line DOyx. The terminals RAS and CAS of all the memory chips (M00 to M77) are connected to a signal line RAS and a signal line CAS, respectively. As shown in FIG. 1, while the signal line CAS is connected to the memory bank 310 by a signal line CAS0 of the latter, it is connected to the memory banks 320 and 330 by, respectively, signal lines CAS1 and CAS2 of the latter. The signal input terminals WE of each eight memory chips which are continuously arranged in the horizontal direction are connected to each other. The input terminals WE of the individual groups M1x, M2x, M3x, M4x, M5x, M6x and M7x are connected to signal lines WE0, WE1, WE2, WE3, WE4, WE5, WE6 and WE7, respectively.

The operation of the memory bank 310 shown in FIG. 3a will be described. Since the illustrative embodiment is designed for an application in which the main and subscanning directions in a data write mode are fixedly associated with, respectively, the horizontal and vertical directions with respect to the arrangement of memory chips, the terminals WE of each eight chips which are sequentially arranged in the horizontal direction are connected to each other. Hence, when data are to be written, eight memory chips of any of the horizontally arranged groups are conditioned for a write mode at the same time. Specifically, when predetermined address information is fed over the address line AD while feeding predetermined signals over the signal lines $\overline{RAS}$ and $\overline{CAS}$ and, at the same time, the signal line $\overline{WE0}$ is made low level, data supplied over the data input lines Di0, Di1, Di2, Di3, Di4, Di5, Di6 and Di7 are simultaneously written in the memory addresses of the individual memory chips M00, M01, M02, M03, M04, M05, M06 and M07 which are designated by the address information on the address line AD.

Likewise, when the signal line $\overline{WEy}$ (y=1 to 7) is made low level, data sent over the data input lines Di0, Di1, Di2, Di3, Di4, Di5, Di6 and Di7 are simultaneously written in the memory addresses of the memory chips My0, My1, My2, My3, My4, My5, My6 and My7 which are designated by address information fed over the address line AD. To read out data, all the signal lines WE0 to WE7 are made (logical) high level, H. In this condition, as predetermined address information is fed over the address line AD with predetermined signals being fed over the signal lines $\overline{RAS}$ and $\overline{CAS}$, data are simultaneously read out of those addresses, or memory cells, of all the memory chips Myx which are designated by the address information on the line AD, the data appearing on the individual signal lines DOyx. In a read mode, therefore, in response to a single memory access operation, the sixty-four memory cells are accessed at the same time, i.e., sixty-four bits of memory cells are allocated to a single memory address.

Figure 7A:
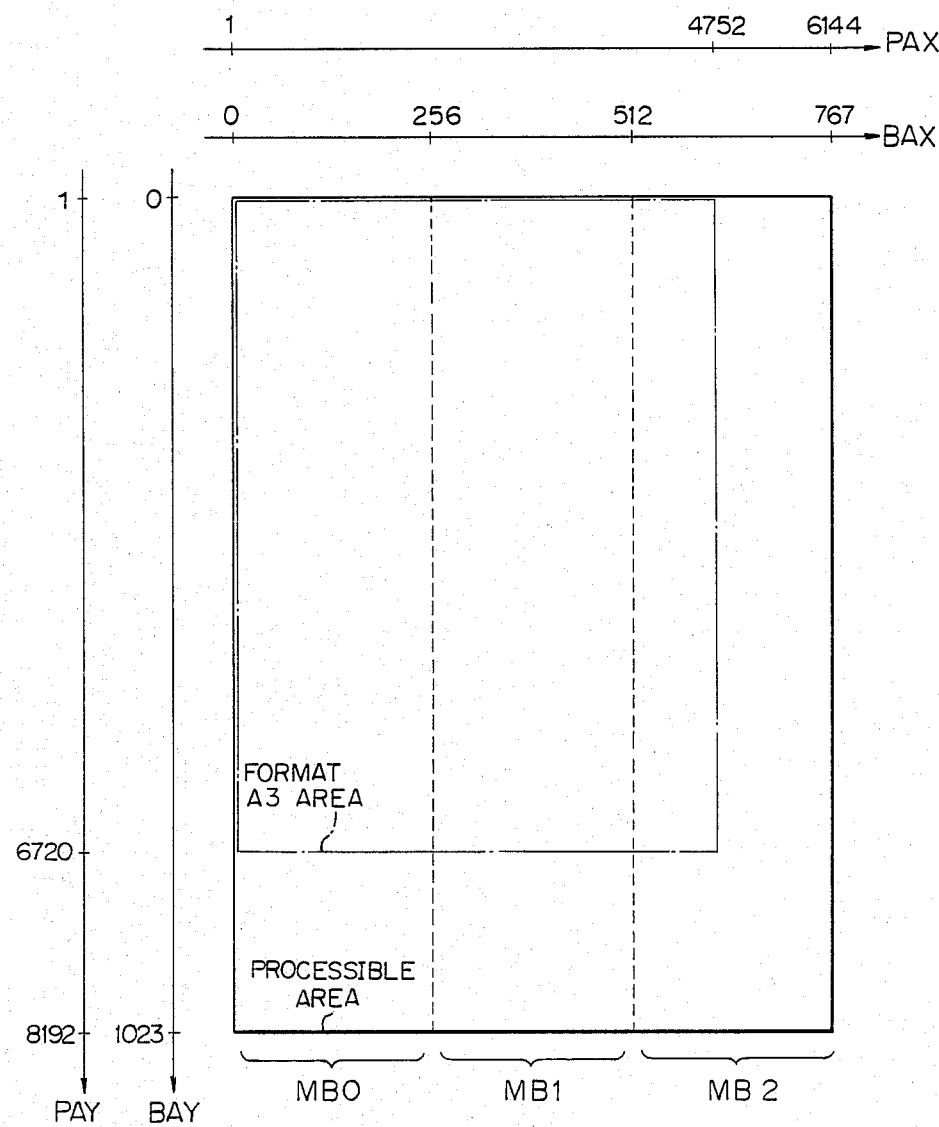
FIG. 7a is a schematic diagram showing a positional relationship between pixel coordinates PAX and PAY, memory address coordinates BAX and BAY, and memory banks MB0, MB1 and MB2.

The technical background on which the design of the image memory board as described above is based is as follows. The maximum image size was assumed to be A3 or greater, and the pixel density of image data was assumed to be 16 pixels per millimeter, meaning that the memory capacity required of an image memory was 4752×6720 bits. To implement such an image memory, a pixel address space of 6144 (PAX)×8192 (PAY) was set up, as shown in FIG. 7a. 8×8 bits of memory cells were allocated to each memory address (MA) so as to effect rapid access with no regard to the direction of continuous scanning, i.e., vertical or horizontal. Hence, the memory address coordinates BAX and BAY were determined to be, respectively, 0 to 767 and 0 to 1023 which are one-eighth of the pixel address coordinates PAX and PAY, respectively.

Figure 7B:
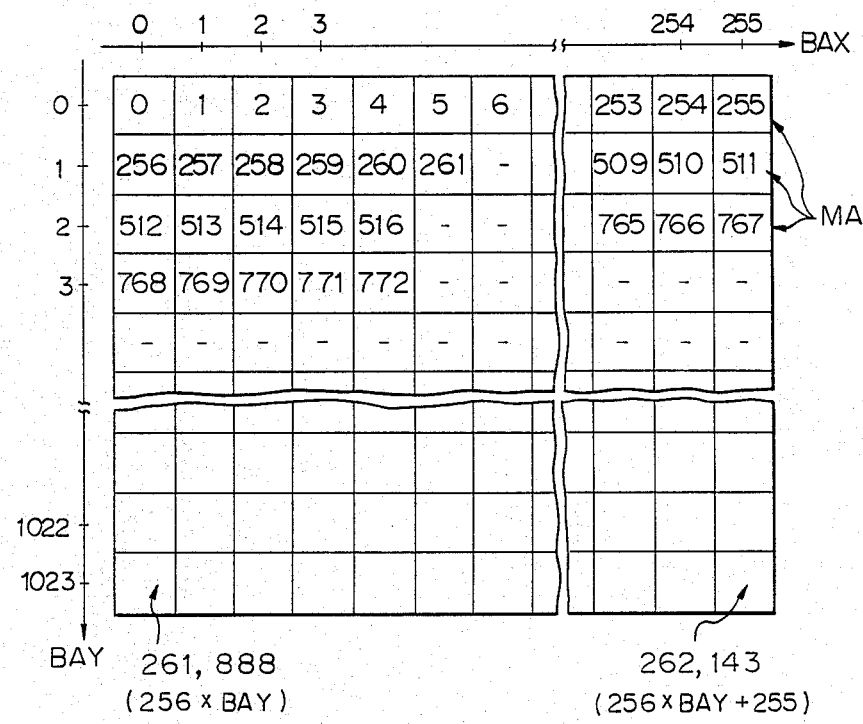
FIG. 7b is a schematic view showing a relationship between memory address coordinates BAX and BAY and memory addresses MA.

Since use was made of memory chips each having a capacity of 256 kilobits, the coordinates of memory addresses to be provided in individual memory chips were determined to be 0 to 255 in the x direction and 0 to 1023 in the y direction. Specifically, as shown in FIG. 7b, the values of addresses (MA) applied to each memory chip are 256×BAY+BAX where BAX (0 to 255) and BAY are the memory address coordinates. In this condition, the memory address coordinates BAX available with a single memory chip are 0 to 255 and cannot implement the coordinates 0 to 767 required. Hence, as shown in FIG. 7a, three memory banks MB0, MB1 and MB2 each having 256 different memory address coordinates BAX were arranged such that their BAXs became continuous, i.e., the memory banks MB0, MB1 and MB2 had coordnates BAX of 0 to 225, 256 to 511 and 512 to 767, respectively.

Figure 7C:
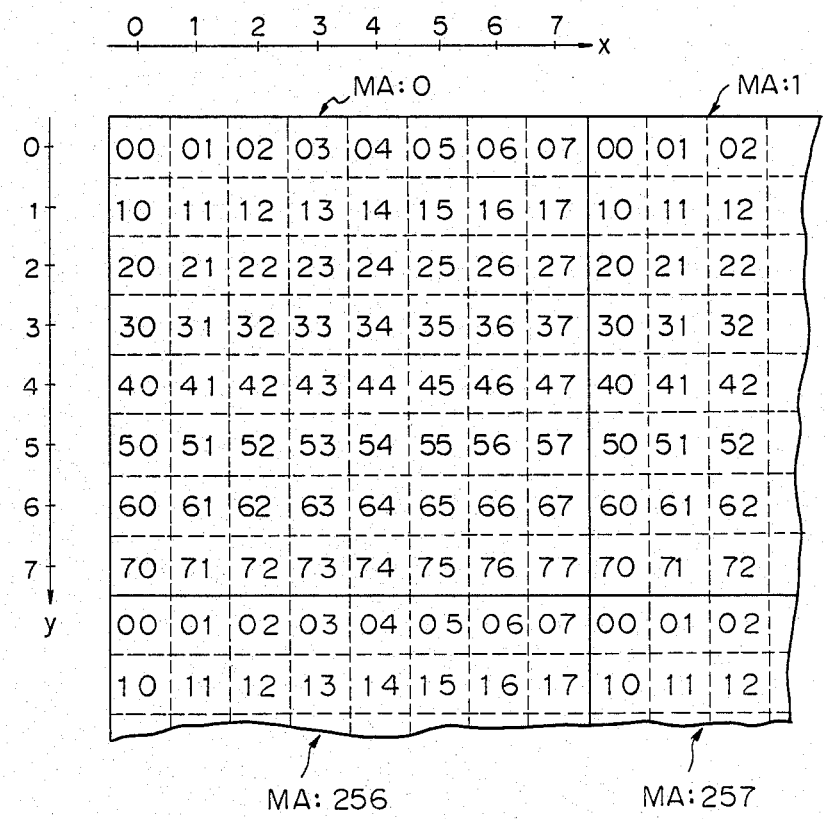
FIG. 7c is a schematic view showing a relationship between memory addresses and memory cell groups.

As shown in FIG. 7c, each of the regions which may be designated by the memory address MA accommodates sixty-four (8×8) memory cells. Each two-figure number (yx) shown in FIG. 7c is representative of the y and x coordinates of a particular memory cell. The memory cells indicated by such x and y coordinates are individually associated with the pixels which are specified by the pixel address coordinates PAX and PAY as shown in FIG. 7a.

The image memory board of FIG. 2 is derived from the background as discussed above. The memory banks MB0, MB1 and MB2 of FIG. 7a correspond, respectively, to the memory banks 310, 320 and 330 of FIG. 1. In the circuitry of FIG. 1, therefore, the selection of the memory bank MB0, that of the memory bank MB1 and that of the memory bank MB2 are controlled by the signal lines $\overline{CAS0}$, $\overline{CAS1}$ and $\overline{CAS2}$ respectively. Further, the memory addresses MA shown in FIG. 7b are associated with 18-bit address information appearing on the address line AD of FIG. 1. The lower eight bits of the address information are associated with the x coordinate BAY (0 to 255) while the upper ten bits are associated with the y coordinates BAY (0 to 1023). The memory cells 00 to 77 shown in FIG. 7c are included in each of the memory chips M00 to M77 of FIG. 3a.

Figure 3B:
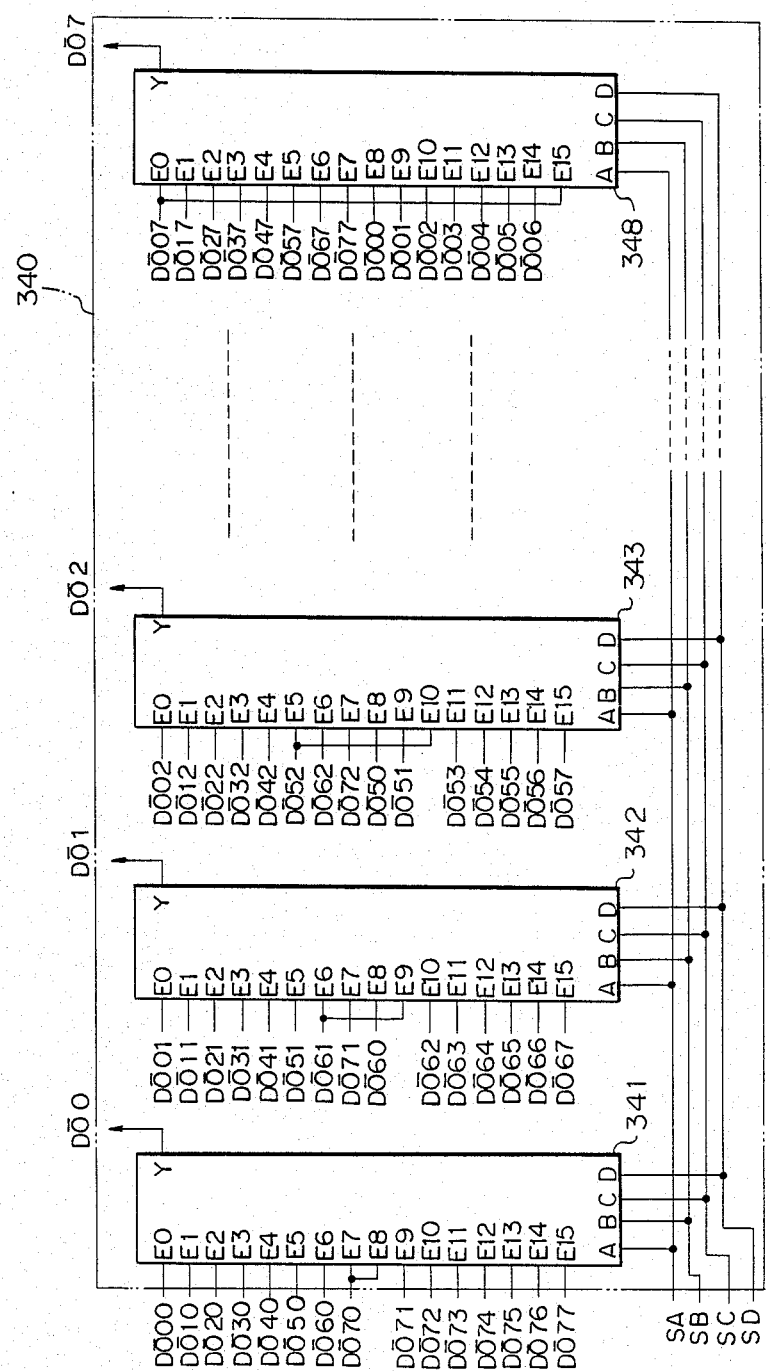

Referring to FIG. 3b, the data selector circuit 340 of FIG. 1 is shown in detail. As shown, the data selector circuit 340 includes eight data selectors 341, 342, 343, 345, 346, 347 and 348 although a part of them is not shown. Each of the data selectors 341 to 348 is provided with sixteen data input terminal E0 to E15, one data output terminal Y, and four control terminals A, B, C and D. The data output terminals Y of the data selectors 341 to 348 are connected to data output lines D00, D01, D02, D03, D04, D05, D06 and D07, respectively. The control terminals A, B, C and D of the data selectors 341 to 348 are commonly connected to the signal lines SA, SB, SC and SD, respectively.

Each of the data selectors 341 to 348 outputs on its data output terminal Y a signal which is applied to one of its input terminals that is selected on the basis of the combination of signals appearing on the control terminals A, B, C and D. Specifically, assuming that a value represented by the combiation of signals applied to the control terminals A, B, C and D is i, the input terminal Ei (i=0 to 15) is selected. It is to be noted that assuming that the statuses of the control terminals A, B, C and D are LA, LB, LC and LD, respectively, and that the high level is ONE and the low level is ZERO, the number i of input terminal selected is determined as follows:

$$i = LA \cdot 2^0 + LB \cdot 2^1 + LC \cdot 2^2 + LD \cdot 2^3$$

It follows that, for example, when LA is low level, LB is high level, LC is low level and LD is high level, the input terminal E10 is selected.

The data input terminals E0, E0, E2, E3, E4, E5, E6, E7, E8, E9, E10, E11, E12, E13, E14 and E15 are connected to data buses D000, D010, D020, D030, D040, D050, D060, D070, D070, D071, D072, D073, D074, D075, D076 and D077, respectively. The daa input terminals E0 to E7 of the data selector 342 are connected to, respectively, the data buses D001 to D070 while the data input terminals E8 to E15 are connected to, respectively, the data buses D060 to D076.

Likewise, the data input terminals of the other data selectors 343 to 348 are connected to the data buses as follows. data selector 343:

E0 to E7→D002 to D070, E8 to E15→D050 to D057
data selector 344:

E0 to E7→D003 to D073, E8 to E15→D040 to D047
data selector 345:

E0 to E7→D004 to D074, E8 to E15→D030 to D037
data selector 346:

E0 to E7→D005 to D075, E8 to E15→D020 to D027
daa selector 347:

E0 to E7→D006 to D076, E8 to E15→D010 to D017
data selector 348:

E0 to E7→D007 to D077, E8 to E15→D000 to D007

With the above configuration, the data selector circuit 340 selects eight bits out of sixty-four bits of data which are outputted by one of the memory banks 310, 320 and 330 and delivers them to the data output lines DO0 to DO7. As described in detail later, signals each sequentially changing its status depending upon the scanning position are applied to the signal lines SA, SB and Sc, and a signal for indicating a scanning direction is applied to the signal line SD. Specifically, the signal line SD becomes low level when the x direction (horizontal as viewed in the figure) is selected to be the main scanning direction and high level when the y direction is selected to be the main scanning direction.

As previously stated, each of the data selectors 341 to 348 selects one of the input terminals E0 to E7 when the signal line SD is low level and one of the input terminals E8 to E15 when the signal line SD is high level. Therefore, when the x direction is the main scanning direction, one row of data in the horizontal or x direction are outputted simultaneously to the data lines DO0 to DO7 out of the 8×8 memory cell group which are present at each memory address. The position of the memory cell row selected with respect to the vertical direction is dependent upon the statuses of the signal lines SA, SB and Sc. On the other hand, when the y direction is selected to be the main scanning direction, one column of data in the vertical direction are simultaneously fed to the data lines DO0 to DO7 out of the 8×8 memory cell group. Again, the position of the memory cell column selected with respect to the horizontal direction is dependent upon the statuses of the signal lines SA, SB and SC.

Figure 4:
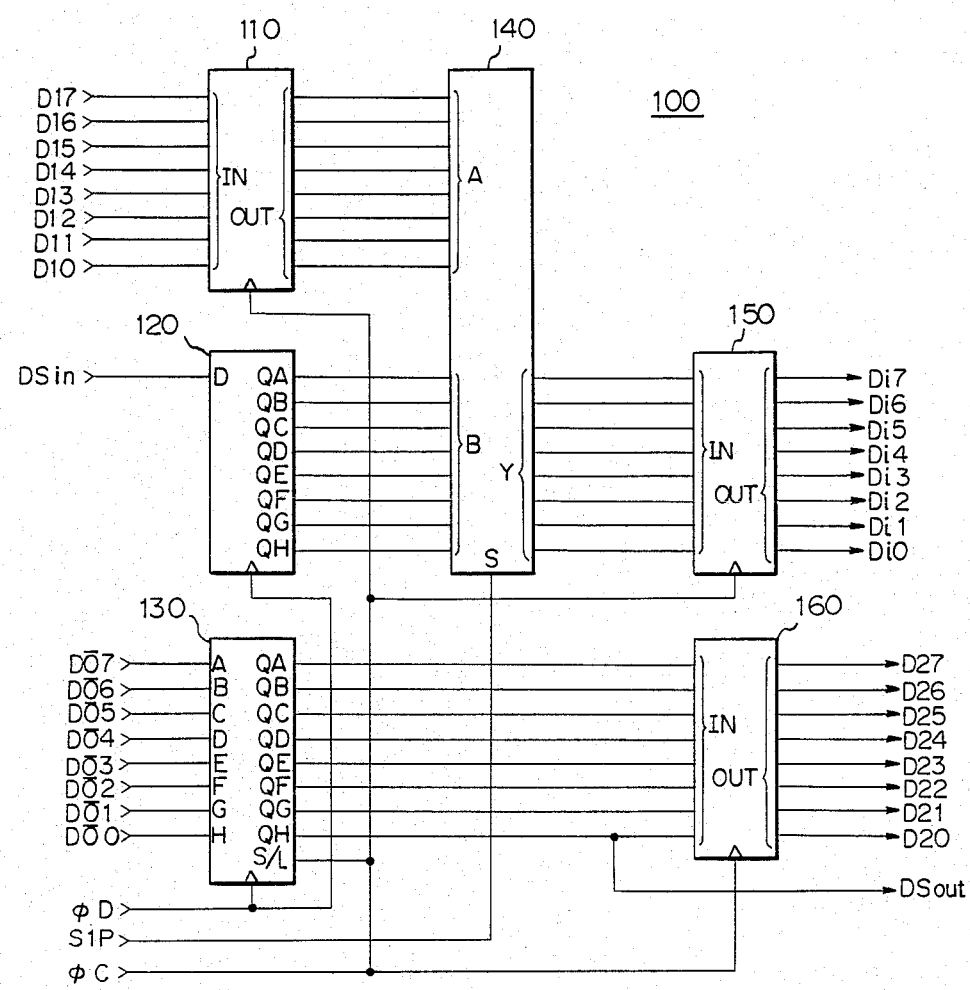
FIG. 4 is a schematic block diagram showing a data controller as shown in FIG. 2.

Referring to FIG. 4, the data controller 100 is shown in detail and includes a latch 110, shift registers 120 and 130, a data selector 140, and latches 150 and 160. The latch 110 has 8-bit input terminals connecting to the parallel input lines D10 to D17, and 8-bit output terminals connecting to 8-bit input terminals of a group A of the data selector 140. The shift register 120 has a data input terminal D connecting to the serial data input line DSin, and 8-bit parallel data output terminals QA to QH connecting to 8-bit input terminals of a group B of the data selector 140. The data selector 140 has an 8-bit output terminal group Y connecting to the 8-bit data lines Di0 to Di7 via the latch 150.

Further, the shift register 130 has 8-bit parallel data input terminals A to H connecting to the data output lines DO7 to DO0, and 8-bit parallel data output terminals QA to QH connecting to the data output lines D27 to D20 via the latch 160. One QH of the parallel data output terminals of the shift register 130 is connected to the serial data output line DSout. In this construction, serial data arriving at the serial data input line DSin are converted into parallel data by the shift register 120, and parallel data appearing on the data output lines DO0 to DO7 are converted into serial data by the shift register 130 to appear on the serial data output line DSout. In response to a signal applied to the signal line SIP, the data selector 140 selects one of a signal applied to the parallel data input line and a signal applied to the serial data input line, selectively delivering it to the data input lines Di0 to Di7.

Figure 5A:
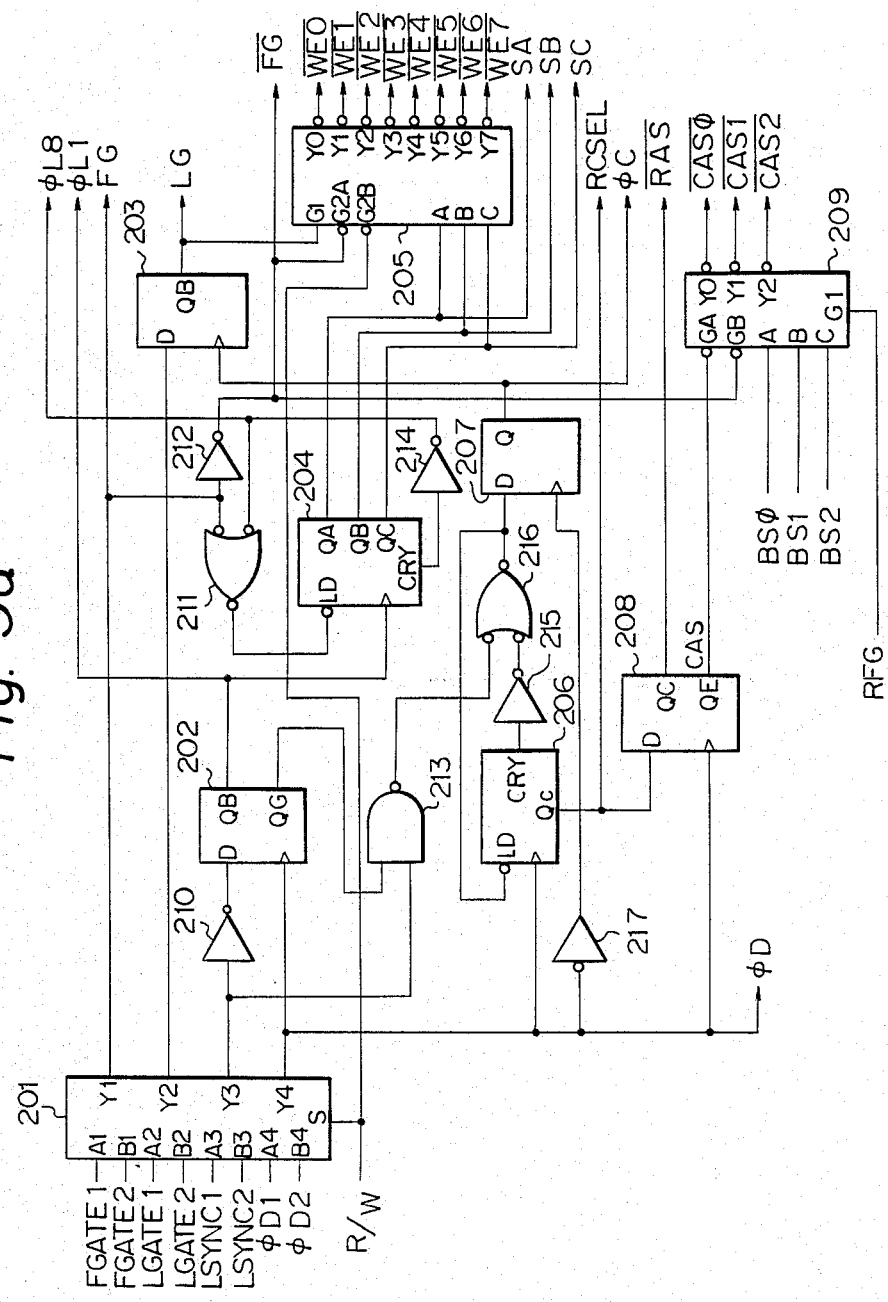
FIGS. 5a and 5b are schematic block diagrams showing a read/write controller as also shown in FIG. 2.
Figure 5B:
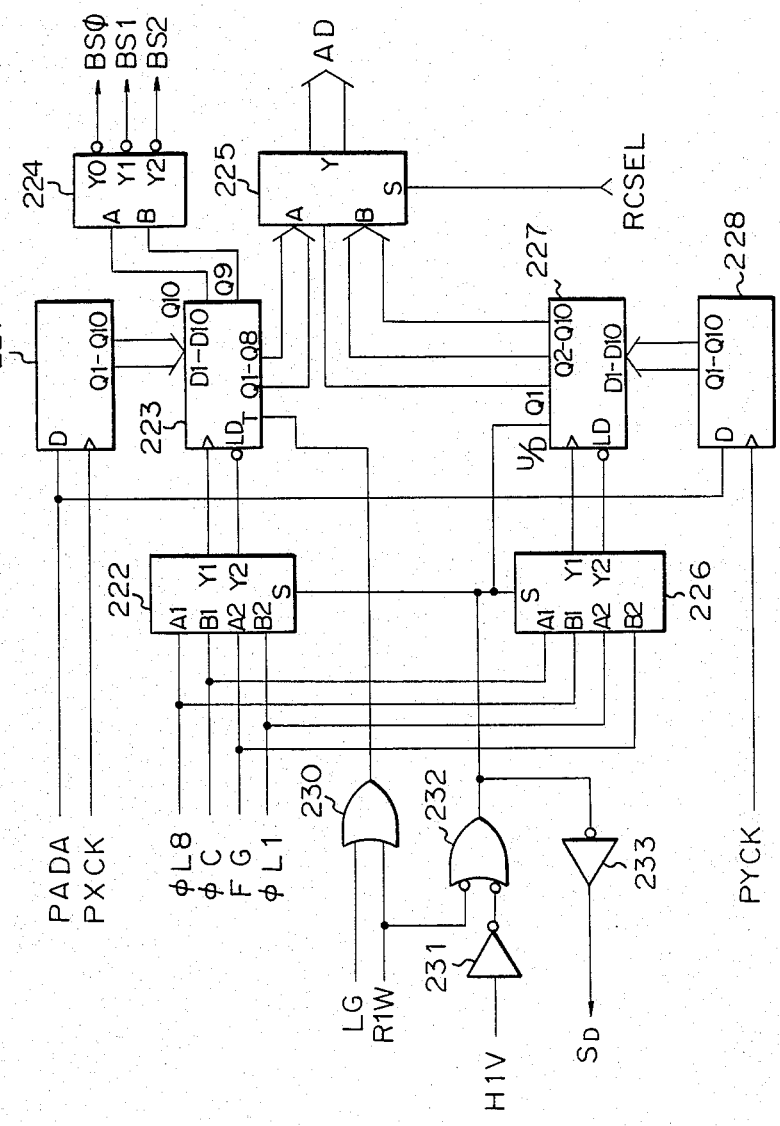

Referring to FIGS. 5a and 5b, the read/write controller 200 is shown in detail. As shown, the controller 200 includes a data selector 201, shift registers 202 and 203, a counter 204, a decoder 205, a counter 206, a latch 207, a shift register 208, a decoder 209, inverters 210, 212, 214, 215 and 217, and gates 211, 213 and 216. The data selector 201 is provided with an input terminal group A made up of four input terminals A1, A2, A3 and A4, an input terminal group B made up of four input terminals B1, B2, B3 and B4, four output terminals Y1, Y2, Y3 and Y4, and a switching control terminal S. Depending upon the status of the control terminal S, the data selector 201 selects one of the input terminal groups A and B so that signals applied to the terminal groups selected are delivered to the output terminals Y1 to Y4.

The input terminals belonging to the group A are connected to the signal lines FGATE1, LGATE1, LSYNC1 and $\phi$D1 of the input device such as an image scanner while those belonging to the group B are connected to the signal lines FGATE2, LGATE2, LSYNC2 and $\phi$D2 of the output device such as a printer. Connected to the switching control terminal S is the signal line R/W. The signals appearing on the output terminals Y1 and Y4 of the data selector 201 are designated FG and $\phi$D, respectively. The signals appearing on the output terminals Y2 and Y3 of the data selector 201 are individually adjusted in timing and converted into internal signals L and $\phi$L1, respectively.

Comprising an octal counter, the counter 204 generates signals SA, SB, SC and $\phi$L8 by counting the clock pulses $\phi$L1. The signal $\phi$L8 has eight times greater period than the clock pulses $\phi$L1 and is synchronous to the timing for switching the memory address (signal on AD, i.e., MA). The statuses of the signals SA, SB and SC are representative of a scanning position (0 to 7) in each memory address with respect to the subscanning axis.

The decoder 205 decodes the 3-bit signals SA, SB and SC to produce 8-line signals. The output signals of the decoder 205 are fed through the terminals Y0 to Y7 to the eight signal lines $\overline{WE0}$ to $\overline{WE7}$. When scanning is effected any of the signal lines WE0 to WE7 becomes low level. Since the statuses of the signals SA, SB and SC are the result of counting of the clock pulses $\phi$L1, the signal line which becomes low level is sequentially changed on the basis of one main scanning line. When any of the signal lies $\overline{WE0}$ to $\overline{WE7}$ becomes low level, its associated memory chip group M0x, M1x, M2x, M3x, M4x, M5x, M6x or M7x (x=0 to 7) shown in FIG. 3a is conditioned for a write mode. Further, the signals SA, SB and SC are routed to the data selector circuit 340 of FIG. 3b to serve as a control signal.

As shown in FIG. 5b, the read/write controller 200 further ncludes a shift register 221, a data selector 222, a counter 223, a decoder 224, data selectors 225 and 226, a counter 227, a shift register 228, inverters 231 and 233, and gates 230 and 232. The counter 223 comprises a 10-bit up-counter, i.e., a 1024-bit counter and functions to generate an x direction memory address coordinate BAX (0 to 767), FIG. 7a. The counter 227 comprises a 1024-bit up-down counter and serves to generate a y direction memory address coordinate BAY (0 to 1023), FIG. 7a. Each of these counters 223 and 227 is provided with preset data input terminals D1 to D10. In this configuration, an address at which scanning should begin can be specified by presetting data in the counters 223 and 227. In this specific construction, to reduce the number of signal lines, shiftregisters 221 and 228 are connected to, respectively, the preset data input terminals of the counters 223 and 227 for thereby entering data as serial data.

Figure 6A:
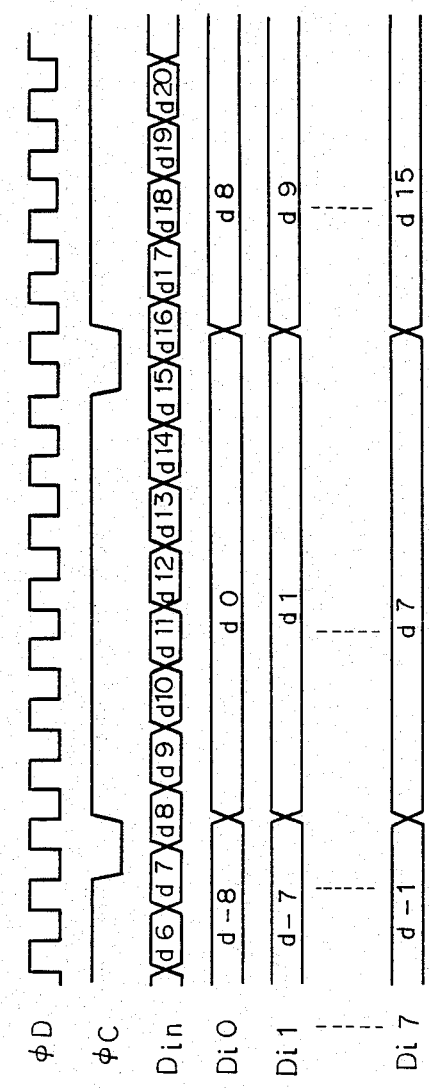
FIGS. 6a, 6b, 6c, 6d, 6e, 6f and 6g are timing charts representative of various signals which appear in the image memory board of FIG. 2.
Figure 6B:
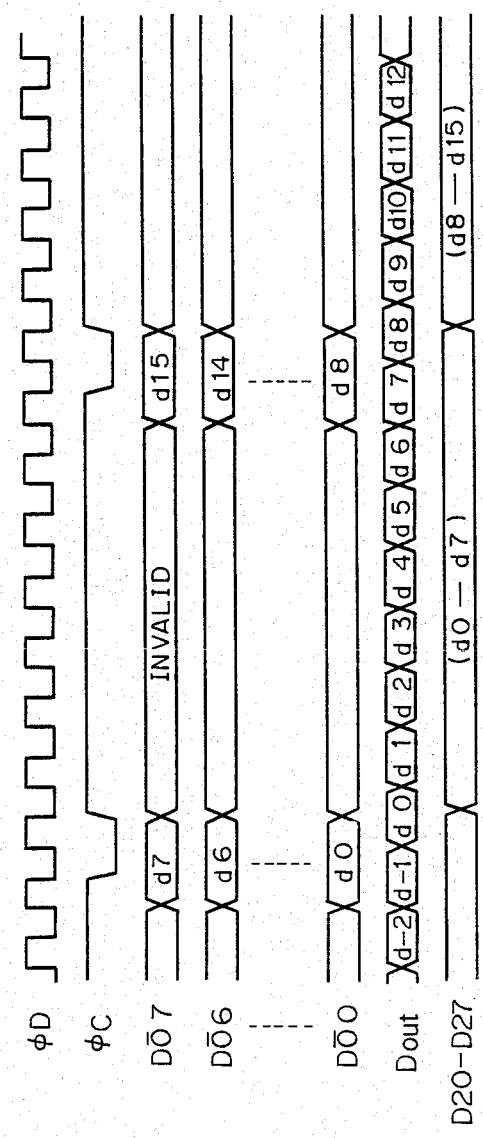
Figure 6C:
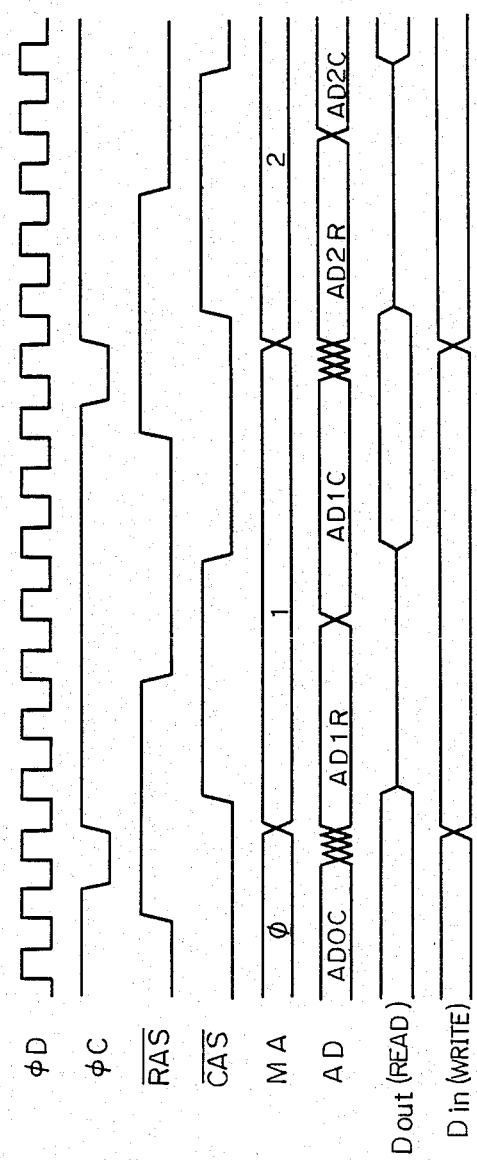
Figure 6D:
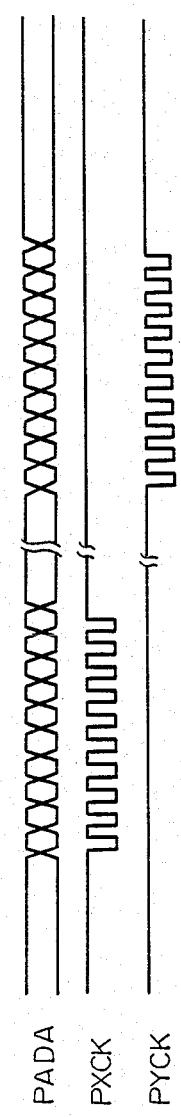

The serial data to be preset in the counters 223 and 227 are applied to the shift registers 221 and 228 over the signal line PADA. Applied to the signal lines PXCK and PYCK are clock pulses adapted for the synchronization of the serial data. The timing of these clock signals are shown in FIG. 6d. In order to switch the direction in which the addresss as generated by the counters 223 and 227 is changed, i.e., the scanning direction, the data selector 222 is connected to a clock pulse input terminal and a load control terminal (LD) of the counter 223 while the data selector 226 is connected to a clock pulse input terminal and a load control terminal (LD) of the counter 227. Applied to input terminals A1, B1, A2 and B2 of the data selector 222 are the signals $\phi$L8, $\phi$C, FG and $\phi$L1, respectively. Applied to input terminals A1, B1, A2 and B2 of the data selector 226 are the signals $\phi$C, $\phi$L8, $\phi$L1 and FG, respectively. The switching control terminals S of the data selectors 222 and 226 are connected to the output terminal of the gate 232. Also connected to the output terminal of the gate 232 is an up-down (U/D) control terminal of the counter 227.

Figure 6E:
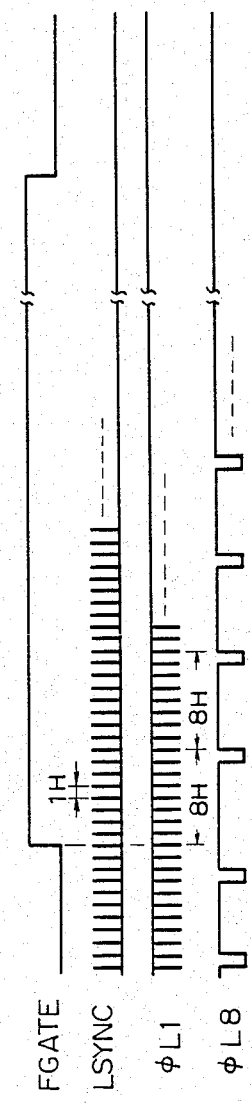
Figure 6F:
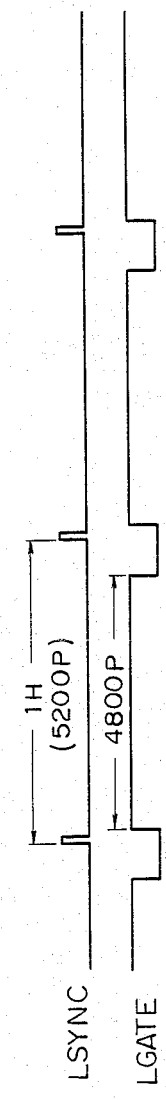
Figure 6G:
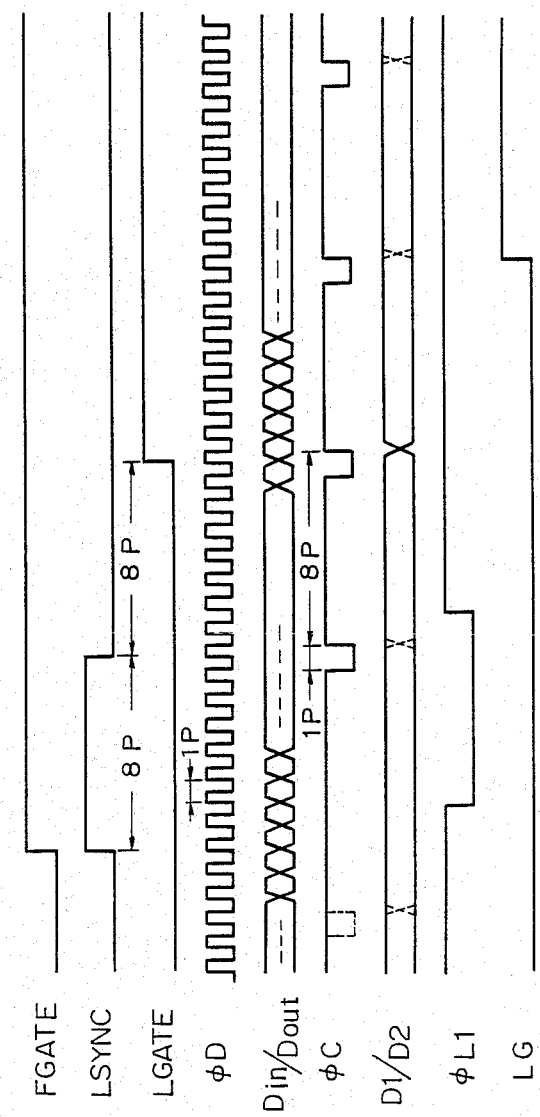

When the signal line W/R is low level, meaning that the image memory is in a write mode, or when the signal line H/V is high level, meaning that horizontal scanning is specified, main scanning occurs forward in the horizontal direction (coordinate BAX) and subscanning occurs in the vertical direction (coordinate BAY). In this condition, the output terminal of the gate 232 is high level so that the data selectors 222 and 226 select the input terminal group B and, therefore, the signals $\phi$C and $\phi$'are applied to, respectively, the clock pulse input terminal and load control terminal of the counter 223. Applied to the clock pulse input terminal and load control terminal of the counter 227 are, respectively, the signal $\phi$L8 and FG. Consequently, when the signal $\phi$L1 becomes low level, the counter 223 presets data (initial value of BAX) being outputted by the shift register 221 and counts the number of pulses $\phi$C. As shown in FIG. 6g, the pulses $\phi$C are eight times greater in period than the clock pulses $\phi$D1 (or $\phi$D2) which appear once for each pixel coordinate (PAX) of main scanning. Hence, the counter 223 is sequentially updated forward with respect to the direction of the memory address coordinte BAX, every time the pixel coordinate in the main scanning direction is updated eight consecutive times.

The counter 227 presets data (initial value of BAY) outputted by the shift register 228 when the signal FG becomes low level and counts the pulses $\phi$L8. As shown in FIG. 6e, the pulses $\phi$L8 have eight times greater period than the synchronizing pulses LSYNC1 (or LSYNC2) which appear once for each pixel coordinate (PAY) of subscanning. Hence, the counter 227 is sequentially updated forward with respect to thememory address coodinate BAY, every time subscanning is repeated eight consecutive times. On the other hand, when the signal line R/W is high level and, yet, the signal line H/V is high level, meaning that the image memory is in a read mode and the scanning direction specified is vertical, main scanning occurs vertically (coordinate BAY) but in the reverse direction and subscanning occurs forward in the horizontal direction (coordinate BAX), a shown in FIG. 7d.

It is to be noted that if the coordinates (BAX, BAY) of the scanning start point P1 are preset in the counters 223 and 227, scanning occurs only in a limited desired region as indicated by an arrow C in FIG. 7d. In this case, since the output terminal of the gate 232 becomes low level, the data selectors 222 and 226 select the input terminal group A and, therefore, the signals $\phi$L8 and FG are supplied to, respectively, the clock pulse input terminal and terminal LD of the counter 223. Also, the signals $\phi$C and $\phi$L1 are applied to, respectively, the clock pulse input terminal and terminal LD of the counter 227. As a result, the counter 223 presets data (initial value of BAX) outputted by the shift register 221 when the sinal FG becomes low level and counts the pulses $\phi$L8. A shown in FIG. 6e, the pulses $\phi$L8 are eight times greater in period than the synchronizing pulses LSYNC1 (or LSYNC2) which appear once for each pixel coordinate (PAY) of subscanning. Hence, the counter 223 is sequentially incremented forward with respect to the memory address coordinates BAX, every time main scanning is repeated eight consecutive times.

The counter 227 presets data (initial value of BAY) outputted by the shift register 228 when the signal $\phi$L1 becomes low level and counts the pulses $\phi$C. As shown in FIG. 6g, the pulses $\phi$C have eight times greater period than the clock pulses $\phi$D1 (or $\phi$D2) which appear once for each pixel coordinate (PAX) of main scanning. At this instant, the output terminal of the gate 232 becomes low level so that the U/D control terminal of the counter 227 is turned into low level causing the counter 227 to down-count. As a result, the counter 227 is sequentially updated reversely (dicrementing direction) with respect to the memory address coordinte BAY, every time the pixel coordinate in the main scanning direction is updated eight consecutive times. Specifically, when the signal line H/V is high level, main scanning and subscanning of the image memory are effected based on the output address information of the counters 223 and 227, respectively; when the signal H/V is low level (when R/W is high level), subscanning and main scanning are effected based on the output address information of the counters 223 and 227, respectively. It is to be noted that while main scanning is performed in the vertical direction, effecting main scanning in the direction for decrementing the coordinate BAY is to match the image data stored in the image memory to the characteristics of a printer used.

The counter 223 asigned to BAX is provided with ten bits of output terminals Q1 to Q10 the lower eight bits (Q1 to Q8) of which are connected to the input terminal group A of the data selector 22 and the upper two bits (Q9 and Q10) to the input terminal of the decoder 224. The decoder 224 decodes an output signal of the counter 223 (upper two bits of BAY) to generate signals BS1, BS2 and BS3 which are fed to the decoder (gate) 209 of FIG. 5a. As a predetermined condition is reached, the sigals BS1, BS2 and BS3 are applied to the signal lines CAS0, CAS1 and CAS2, respectively. When any of the signal lines CAS0, CAS1 and CAS2 is made low level, its associated memory bank 310, 320 or 330 is accessed. In this manner, among the ten bits outputted by the counter 223 as show in FIG. 5b, the lower eight bits serve as address data (AD) which is associated with the memory chips in each memory blank while the upper two bits are adapted for the selection of the memory banks 310, 320 and 330.

As regards the 10-bit output terminal of the counter 227, the lowermost bit Q1 is connected to one of the group A input terminals of the data selector 225 while the upper nine bits are connected to the group B input terminal of the data selector 225. In response to the timing signal RCSEL, the data selector 225 selects one of the group A and group B input terminals and delivers to the output terminal group Y the signals which are applied to the input terminals selected. Specifically, among twenty bits (A0 to A19) of address data generated by the counters 227 and 223, a row address constituted by A0 to A7 and A10 and a column address constituted by A11 to A19 are combined and applied to the 9-bit address line AD on a time division basis.

Details of the statuses of the various signals described so far are represented by the flow charts of FIGS. 6a, 6b, 6c, 6d, 6e, 6f and 6g.

Hereinafter will be described the operation of the entire image memory board. When 8-bit parallel data are to be written in the image memory, they are applied to the parallel data input lines DI0 to DI7; when serial data are to be written in the same, they are applied to the serial data input line DSin. The data inputted through the parallel data input lines or the serial data input line are routed to the memory unit 300 via the data controller 100 and data lines Di0 to Di7. The serial data are converted into 8-bit parallel data while being passed through the data controller 100.

Position data (PAX, PAY) representative of particular memory cells for writing data is generated based on the pixel clock pulses ($\phi$D1) and main scanning synchronizing pulses (LYSNC1) as outputted by the data input device (e.g. image scanner). If PAX lies in the range of 1 to 2048, i.e., if BAX lies in the range of 0 to 255, the memory bank 310 is selected; if PAX lies in the range of 2049 to 4096, i.e., if BAX lies in the range of 256 to 511, the memory bank 320 is selected; and if PAX lies in the range of 4097 to 6144, i.e., if BAX is one of 512 to 767, the memory bank 330 is selected. The selection of the memory banks is controlled by signals which are applied to CAS0, CAS1 and CAS2.

The address informatin applied to each memory bank is representative of, in the main scanning direction, the coordinate as assigned to each eight pixels of input data, i.e., BAX (0 to 255) and, in the subscanning direction, the coordinate as assigned to each eight main scanning lines of input data, i.e., BAY (0 to 1023). The BAX and BAY are multiplexed and, then, fed to all the memory chips M00 to M77 of each memory blank via the 9-bit address line AD. Hence, one memory address MA is associated with a 64-pixel two-dmensional area which is constituted by eight pixels continuous in the main scanning direction and eight pixels continuous in the subscanning direction. The sixty-four pixels of input data are associated one-to-one with the memory cells which are included in the sixty-four memory chips M00 to M77.

At each of the memory addresses, as the pixel coordinate (PAY) in ths subscanning direction sequentially changes from 0 to 7, the signal lines WE0 to WE7 becomes a low level each at a predetermined timing. As any of the signal lines WE0 to WE7 becomes low level, its associated memory chips kM00 to M07, M10 to M17, M20 to M27, M30 to M37, M40 to M47, M50 to M57, M60 to M67 or M70 to M77 are brought into a write mode, the others being brought into a read mode. So far as an image scanner is concerned, image data outputted thereby are serial data. As such serial data are applied to the image memory board, eight consecutive pixel data in the main scanning direction are converted into parallel data and individually appear on the data lines Di0 to Di7.

Depending upon the pixel coordinate (PAY) in the subscanning direction of that instant, i.e., the statuses of the signal lines WE0 to WE7, the data on the data lines Di0 to Di7 are written in any one of the memory chips M00 M07, M10 to M17, M20 to M27, M30 to M37, M40 to M47, M50 to M57, M60 to M67, and M70 to M77. Therefore, eight pixel data which are continuous in the main scanning direction are written at the same time. In this manner, since the writing period is eight times greater than the pixel period of serial input data, the allowable access time to each memory chip may be increased to cope with a great data period, i.e., high scanning rate of an input device.

To read data out of the image memory, position information (PAX, PAY) associated with memory cells for reading out data is generated based on the pixel clock pulses ($\phi$D2) and main scanning synchronizing pulses (LSYNC2) as outputted by the output device such as a printer. As in the writing operation, if PAX lies in the range of 1 to 2048, i.e., if BAX is one of 0 to 255, the memory bank 310 is selected; if PAY lies in the range of 2049 to 4096, i.e., if BAX is one of 256 to 511, the memory bank 320 is selected; and if PAX lines in the range of 4097 to 6144, i.e., if BAX is one of 512 to 767, the memory bank 330 is selected.

The BAX lying in the range of 0 to 255 and the BAY lying in the range of 0 to 1023 are applied over the address line AD to the sixty-four memory chips of each memory bank as memory address. Hence, in the reading operation, too, each memory addess MA is associated with a 64-pixel two-dimensional area which is constituted by eight pixels continuous in the main scanning direction and eight pixels continuous in the subscanning direction. In this instance, as regards the sequence of memory cell selection, i.e., the scanning direction for reading, the main and subscanning directions may be replaced with each other. Specifically, while in a writing operation the main scanning is effected as indicated by an arrow A in FIG. 7d, in a reading operation any of the scanning directions indicated by A and B may be selected as desired. The scanning (horizontal scanning) indicated by the arrow A is selected when the signal line H/V is high level, and the scanning (vertical scanning) indicated by the arrow B is selected when it is low level.

During data reading, all the signal lines WE0 to WE7 become high level. In this case, therefore, all the sixty-four memory chips M00 to M77 are conditioned for a read mode so that the sixty-four pixel data in each of the two-dimensional areas are read out at the same time. Eight of the sixty-four pixel data are selected by the data selector circuit 340 and, then, fed over the 8-bit data output lines DO0 to DO7. While the signal line H/V is high level, i.e., when main scanning occurs in the horizontal direction, the data selector circuit 340 selects data outputted by a particular horizontal memory group depending upon the instantaneous vertical pixel position (PAY), e.g., the memory groups M00 to M07, M10 to M17, M20 to M27, M30 to M37, M40 to M47, M50 to 57, M60 to M67 and M70 to M77 if the vertical pixel positions (PAY) are 0, 1, 2, 3, 4, 5, 6 and 7.

On the other hand, when the signal line H/V is low level, i.e., when main scanning occurs vertically, the data selector circuit 340 selects data output by a particular vertical memory group depending upon the instantaneous horizontal pixel coordinate (PAX), e.g., the memory groups M70 to M00, M71 to M01, M72 to M02, M73 to M03, M74 to M04, M75 to M05, M76 to M06, and M77 to M07 if the horizontal pixel coordinates (PAX) are 0, 1, 2, 3, 4, 5, 6 and 7.

It will be seen from the above that whether the direction of subscanning be horizontal or vertical, eight pixel data are read out of the memory at the same time for one memory address. This implies that one memory access allows eight pixels of data to be accessed with no regard to the scanning direction. For this reason, even if the memory access time of the individual memory chips M00 to M77 is relatively long, the entire image memory is capable of reading out data at a high rate. The data reading rate is not slowed down even if the scanning direction is changed.

In FIG. 5a, a signal RFG applied to the gate terminal G1 of the decoder 209 is representative of a refresh period of the memory and generated by a circuit not shown. In the illustrative embodiment, the memory is refreshed by using the interval in which the signal LGATE (signals LGATE1 and LGATE2) remains low level, i.e., the timing at which invalid data are produced.

Figure 9A:
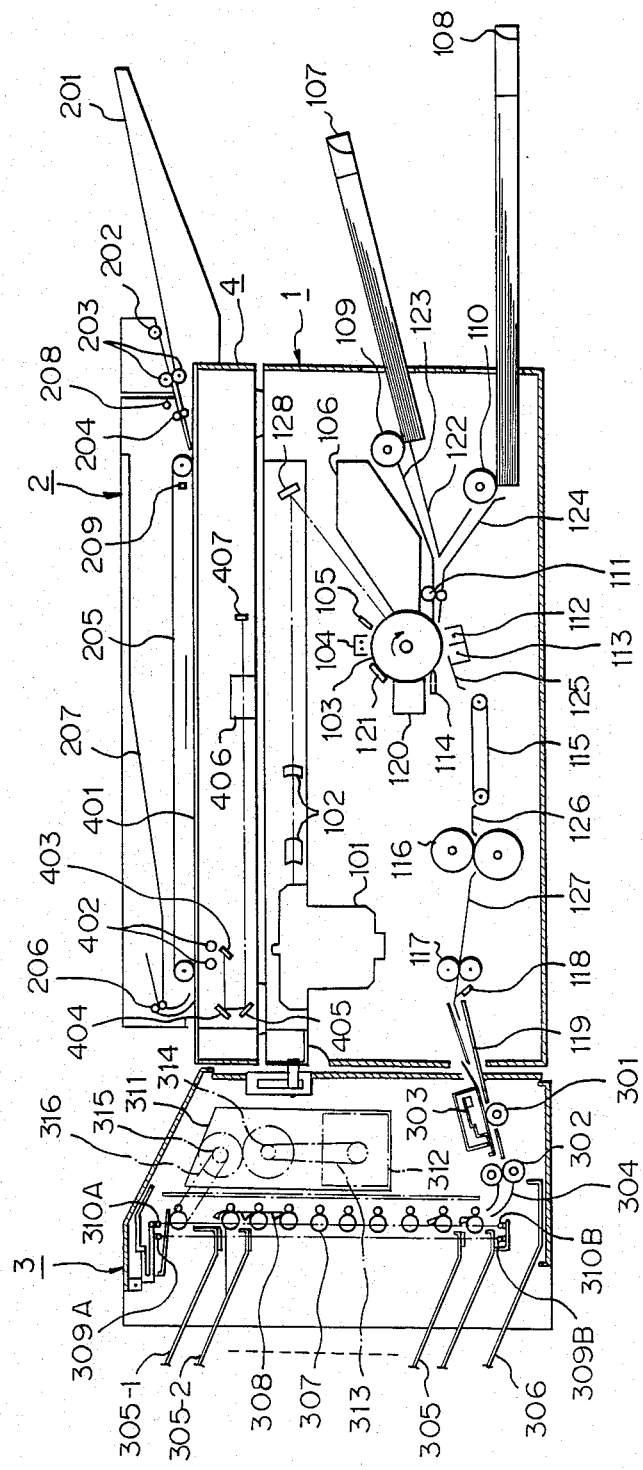
FIGS. 9a and 9b are, respectively, a front view and a schematic block diagram of a digital copier which is equipped with an image memory.
Figure 9B:
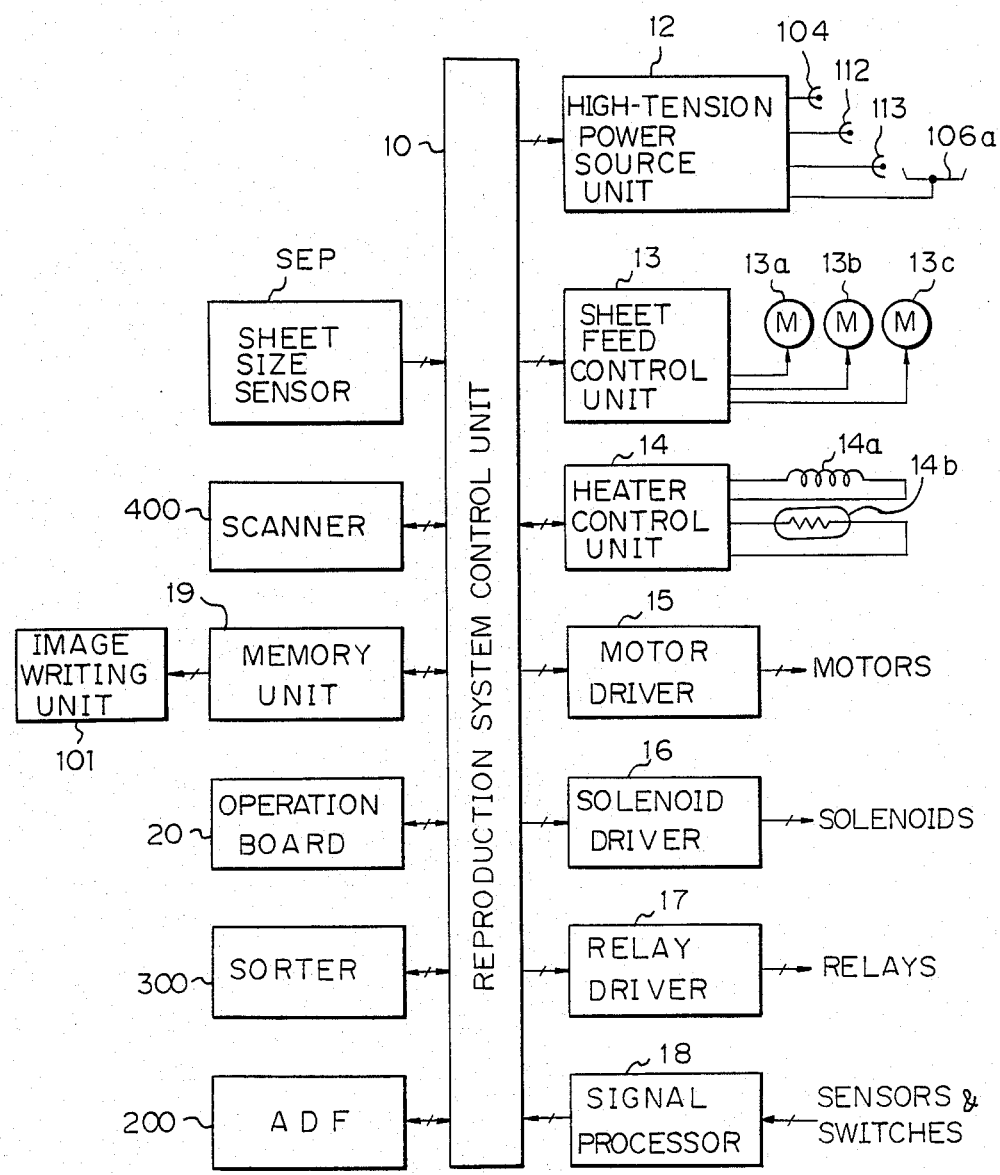

Referring to FIGS. 9a and 9b, there is schematically shown a digital copier to which the image memory board in accordance with the present invention is applied by way of example. As shown, the digital copier includes a laser printer 1, a document feeder 2, a sorter 3, and an image scanner 4. The document feeder 2 feeds original documents one by one from a feed tray 201 so as to position them one at a time on a glass platen 401 of the image scanner 4. In the image scanner 4, an optical scanning system is mechanically driven in a reciprocal motion in the lateral direction, or subscanning direction, as viewed in FIG. 9a, whereby the glass platen 401 is sequentially illuminated. Image light from the document is focused through the scanning system on a one-dimensional image sensor 407. The image sensor 407 effects main scanning in a direction perpendicular to the sheet surface of FIG. 9a.

In the laser printer 1, a photoconductive drum 103 is uniformly charged by corona discharge of the main charger 104 and irradiated by a laser beam which issues from an image writing unit 101. The laser beam is caused to main-scan the drum 103 along the axis of the drum 103 by a polygon mirror, not shown, which is installed in the unit 101. The laser beam is modulated on the basis of image data to be recorded. The drum 103 is rotated clockwise at a constant speed. Hence, an electrostatic latent image associated with a desired image is provided on the surface of the drum 103. A developing unit 106 develops the latent image by using toner. The resulting toner image is transferred from the drum 103 to a paper sheet which is fed from a cassette 107 or 108 to the drum 103. The paper sheet with the toner image is separated by the drum 103, then fixed by a fixing roller 116, and then driven into the sorter 3.

As shown in FIG. 9b, an image reproduction control unit (main controller) 10 is connected to a high-tension power source unit 12, a paper feed control unit 13, a heater control unit 14, a motor driver 15, a solenoid driver 16, a relay driver 17, a signal processor 18, a memory unit 19, an operation board 20, a paper size sensor SEP, the document feeder 2, the sorter 3, and the image scanner 4. The memory unit 19 is the image memory board previously described. Specifically, image data read by the image scanner 4 are temporarily stored in the memory unit 19 and, then, read out after the predetermined processing. The image data read out of the memory unit 19 are used by the image writing unit 101 for modulating the laser beam. Consequently, the image read by the image scanner 4 is reproduced by the laser printer 1 as a hard copy.

The size and orientation of a document laid on the glass platen of the image scanner 4 is not always the same. However, the size and orientation of a paper sheet for recording an image are limited to those of paper sheets which are loaded in the cassettes 107 and 108. Even if the size of a document and that of a paper sheet are different from each other, the size of an image to be reproduced can be matched to that of the paper sheet by adjusting the magnification as defined by a lens 406 of the scanning system. However, when the document and the paper sheet are different in orientation from each other, it is impossible to match the image to the paper sheet despite such adjustment of magnification. Specifically, assuming that a document and a paper sheet of the same size are used, when the orientation of the document and that of the paper sheet are deviated by 90 degrees from each other, an image carried on the document would be partly protruded to the outside of the paper sheet and, therefore, lost. Further, when their orientations are different from each other, adjusting the magnification such that the lengthwise dimension of the document image coincides with the widthwise dimension of the paper sheet would make the reproduction on the paper sheet excessively small and, in addition, cause a substantial area of the paper sheet to be wasted.

In the illustrative application, the image memory board (19) is used to adjust the orientation of an image so that the orientation of a document and that of a paper sheet loaded in the paper feed system may be matched to each other. Specifically, so long as the lengthwise direction of a document and that of a paper sheet are coincident, the image memory board is canned as indicated by the arrow A in FIG. 7d when image data are written in the memory and when they are read thereoutof. When the document and the paper sheet are different in orientation by 90 degrees from each other, image data are written in the image memory board by scanning the board as indicated by the arrow A and read thereoutof by scanning it in the direction B of FIG. 7d, i.e., by replacing the main and subscanning directions with each other. By switching the memory scanning direction so, a document and a paper sheet different in orientated from each other can be matched to each other. In addition, an image can be shifted as desired on the paper sheet by selecting preset data such that the image scanning position is shifted from data writing to data reading when a scanning start position is to be set. Usually, however, the coordinates BAX and BAY of the scanning start position (position P1 shown in FIG.

7d) are so set as to match the position of a document and that of a paper sheet.

In the image scanner 4 shown in FIG. 9a, a document is positioned such that one corner thereof is aligned with one corner of the glass platen 401. Specifically, whatever the size of a document may be, the document is necessarily positioned with one corner thereof laid at the location where both the address coordinates BAX and BAY of the image memory are zero. Hence, only if the coordinaes (BAX, BAY) of the scanning start point are set at 0, 0 when a document image is read by the image scanner 4, when the document size is, for example, A3, the image data are written in a rectangular area of the image memory as defined by four addresses M which are (O, 0), (0, 839), (593, 0) and (593, 839). It follows that when image data are to be read out of the image memory and printed out by the laser printer 1 and if the scanning direction is A shown in FIG. 7d, all that is required for document and a paper sheet to be matched in position is presetting data 0 in both the counters 223 and 227 with no regard to the document size.

Figure 8A:
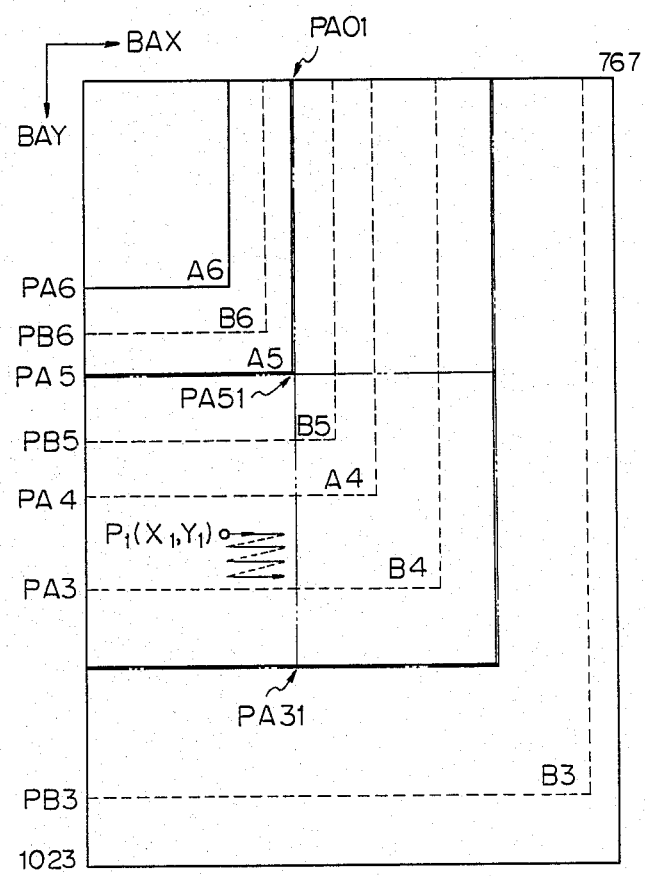
FIG. 8a is a schematic diagram showing correspondence between address coordinates BAX and BAY in an image memory and documents of various sizes.

Assuming that scanning occurs as indicated by the arrow B in FIG. 7d and the document size is any of B3, A3, B4, A4, B5, A5, B6 and A6, the image to be reproduced and the paper sheet can be matched if the coordinates of the point PB3, PA3, PB4, PA4, PB5, PA5, PB6 or PA6 associated with the document size are set, as shown in FIG. 8a. In this embodiment, therefore, a microcomputer installed in the control unit 10 stores a memory table which is shown in FIG. 8b. Specifically, when vertical scanning (arrow B) is specified during recording operation, the control unit 10 determines the coordinates BAX and BAY of a point associated with the size of a document, which was read, referencing the memory table of FIG. 8b and, then, presets them in the counters 223 and 227. No doubt, the scanning start address may be determined by calculation withour using such a memory table. If desired, only a part of an image read from a document may be recorded. For example, after an A3 document has been read, the coordinates of the point PA51 shown in FIG. 8a may be designated to record only one-fourth of the whole document image. The scanning end position may be selected as desired by manipulating the timing signals LSYNC and FGATE which are outputted by the image scanner or the laser printer.

Figure 10A:
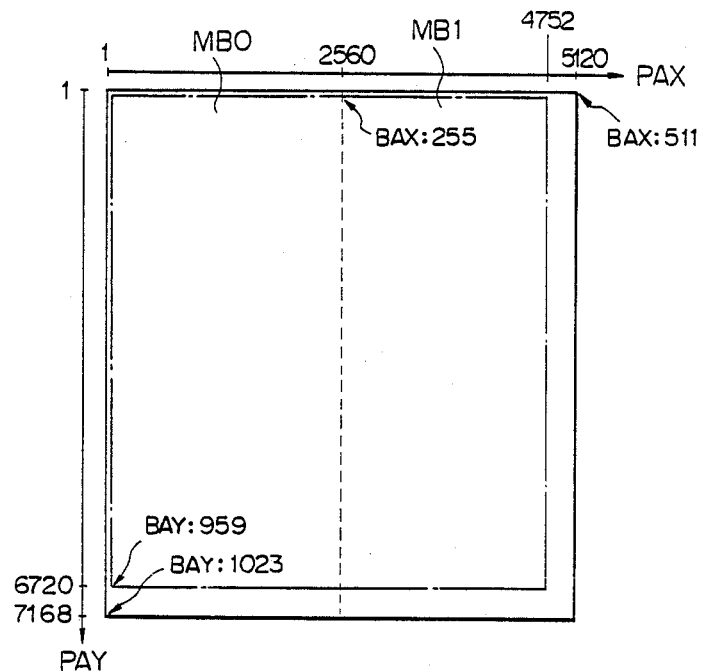
FIGS. 10a and 10b are schematic views showing a memory arrangement in accordance with a modified embodiment of the present invention.
Figure 10B:
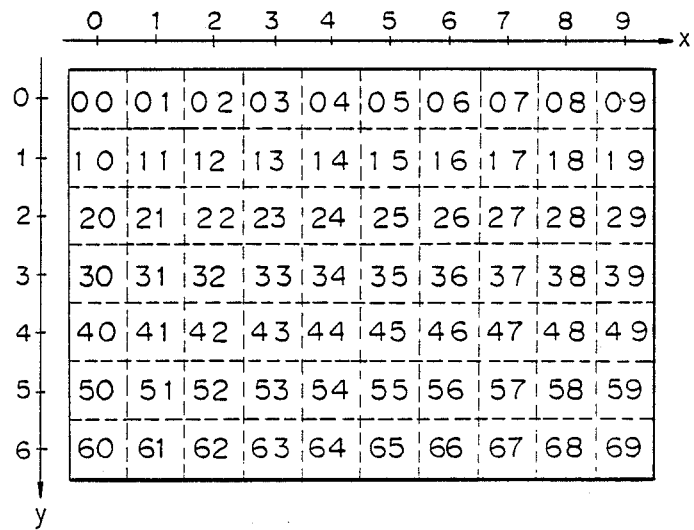

Next, a modification to the image memory in accordance with the present invention will be described. In the foregoing embodiment, the processible area (memory capacity) available with the image memory is far greater than the area corresponding to format A3 as shown in FIG. 7a and, therefore, a substantial part of the memory cells is wasted when the maximum input image size is A3. The modification eliminates such a drawback by modifying the arrangement of memory cell groups, memory addresses and memory banks. Specifically, as shown in FIGS. 10a and 10b, a memory cell group located at the same address is constituted by seventy memory cells in total, i.e., ten in the x direction and seven in the y direction. Hence, the memory address coordinates BAX in the x direction are changed to 0 to 511, and use is made of two memory banks MB0 and MB1 to which BAX of 0 to 511 and BAX of 256 to 511 are assigned respectively. The pixel coordinates PAX in the x direction are changed to 1 to 5120 accordingly. The memory address coordinates BAY in the y direction are 0 to 1023, and the pixel coordinates PAY in the y direction are changed to 1 to 7168.

In the above modification, since the number of memory cells in the same group differs from the x direction to the y direction, the conditions for the generation and changeover of the various kinds of signals have to be changed based on the changeover of the scanning direction, although not shown. For example, the counters 204 and 206 shown in FIG. 5a each has to selectively serve as a heptal counter and a decimal counter depending upon the scanning direction, and the period of the signal $\phi C$ has to be selectively switched to those which are, respectively, seven times and ten times greater than the period of the signal $\phi D$. In this modification, since seven bits of data are read out by one memory access, the data reading speed is far lower than that attainable with the previous embodiment. It is to be noted that even when seven bits or ten bits of data are read out by one memory access, 8-bit parallel data can be outputted if a predetermined conversion circuit is connected to the output of the image memory.

While the embodiment of the present invention has been shown and described as fixing the scanning direction for data writing and selecting either one of horizontal nd vertical scanning directions for data reading, an arrangement may be such that the scanning direction for data writing is changeable. Such an alternative arrangement can be implemented by the following modifications:

(a) The data input terminals Din of all the memory chips included in each memory bank are made independent of each other so as to lead out sixty-four data input lines (DI00 to DI77);

(b) An 8-line input, 64-line output demultiplexer (decoder) is interposed between the data input terminals DiO to Di7 and the four data input lines DI00 to DI77. Signals similar to the signals SA, SB, SC and SD as generated in the previous embodiment are applied to control terminals of the demultiplexer. This circuitry operates in the opposite manner to the data selector 340, FIG. 3b;

(c) The control terminals WE of all the memory chips of each memory bank are made independent of each other so as to lead out sixty-four control lines (WE00 to WE77); and (d) An 8-line input, 64-line output demultiplexer (decoder) is connected between the signal lines WE0 to WE7 and the control lines WE00 to WE77. Signals similar to the signals SA, SB, SC and SD as mentioned above are applied to control terminals of this demultiplexer also. This circuitry, too, operates in the opposite manner to the data selector 340, FIG. 3b.

In summary, it will be seen that the present invention provides a bit map memory capable of switching the main and subscanning directions during data writing and/or data reading and, therefore, capable of accessing a memory rapidly with no regard to the scanning direction. In addition, the device accesses all the pixel data at a constant rate and has an extremely simple circuit for generating memory addresses.

Various modifications will become possible for those skilled in the art after receiving the teachings of the present disclosure without departing from the scope thereof.

What is claimed is:

1. A two-dimensional memory device comprising: memory block means comprising a plurality of individually addressable memory blocks, each memory block having a plurality of memory cells arranged along each of at least two axes in at least one of a square and a non-square array of selectable dimensions;

memory block assembly means comprising a plurality of said memory block means arranged along each of at least two axes;

address information generating means for generating address information for at least one of a data reading and a data writing cycle with respect to each of said axes of said memory block assembly means, and control means for selectively causing said address information with respect to each respective memory block means simultaneously access all memory cells of said respective memory block means during at least one of said data writing and data reading cycle; and data input and output control means for performing selection control on data which are inputted or outputted from a memory cell group of a respective memory block means which is accessed by said address information generating means during at least one of data writing and data reading.

2. A memory device as claimed in claim 1, wherein said data input and output control means comprises selector means for selectively outputting, among two-dimensional data read out of any of said memory block means, one row or one column of data in response to a control signal which specifies a scanning direction, and switching control means for switching said row or said column selected by said selector means in synchronism with a scanning synchronizing signal.

3. A memory device as claimed in claim 1, wherein said address information generating means comprises first counter means for generating address information with respect to first one of said axes of said memory block assembly means, second counter means for generating address information with respect to second one of said axes, and address switching means for replacing a main scanning synchronizing signal and a subscanning synchronizing signal, which are applied to said first and second counter means, in response to a control signal which specifies a scanning direction.

4. A memory device as claimed in claim 3, wherein at least one of said first and second counters comprises presetting means for presetting a value of an address which is to be initially generated by said counter.

5. A memory device as claimed in claim 1, wherein said data input and output control means comprises at least one of serial-to-parallel converting means connected to daa input terminals of said memory block means, and parallel-to-serial converting means for converting parallel data outputted by said memory block means into serial data.

6. A memory device as claimed in claim 2, wherein said data input and output control means comprises at least one of serial-to-parallel converting means connected to data input terminals of said memory block means, and parallel-to-serial converting means for converting parallel data outputted by said memory block means into serial data.

7. A memory device as claimed in claim 3, wherein said data input and output control means comprises at least one of serial-to-parallel converting means connected to data input terminals of said memory block means, and parallel-to-serial converting means for converting parallel data outputted by said memory block means into serial data.

8. A memory device as claimed in claim 4, wherein said data input and output control means comprises at least one of serial-to-parallel converting means connected to data input terminals of said memory block means, and parallel-to-serial converting means for converting parallel data outputted by said memory block means into serial data.

* * * * *